United States Patent
Sanders et al.

(10) Patent No.: US 7,138,733 B2
(45) Date of Patent: Nov. 21, 2006

(54) REDUNDANT DATA AND POWER INFRASTRUCTURE FOR MODULAR SERVER COMPONENTS IN A RACK

(75) Inventors: Michael C. Sanders, deceased, late of Spring, TX (US); Vivian McDaniel-Sanders, legal representative, Spring, TX (US); John D. Nguyen, Cypress, TX (US); Randall Pascarella, Round Rock, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 745 days.

(21) Appl. No.: 10/017,785

(22) Filed: Dec. 13, 2001

(65) Prior Publication Data

US 2003/0112582 A1    Jun. 19, 2003

(51) Int. Cl.
*H01B 7/30*    (2006.01)
(52) U.S. Cl. ..................... 307/147; 307/149
(58) Field of Classification Search ............ 307/52, 307/53, 65, 147, 149
See application file for complete search history.

(56) References Cited

U.S. PATENT DOCUMENTS 5,598,536 A * 1/1997 Slaughter et al. .......... 709/219
6,144,561 A * 11/2000 Cannella et al. ........... 361/796
2003/0056125 A1 * 3/2003 O'Conner et al. ........ 713/300
2003/0065730 A1 * 4/2003 Jones et al. ............... 709/208
2003/0065958 A1 4/2003 Hansen et al.
2004/0073816 A1 4/2004 Hansen

* cited by examiner

*Primary Examiner*—Robert L. Deberadinis

(57) ABSTRACT

A modular infrastructure for a computer server rack, comprising modular server chassis, each chassis configured to receive a plurality of servers and two network switches. The switches are redundantly coupled to each server in the same chassis via point to point links within a data backplane. The rack further comprises redundant AC to DC power supplies configured to transmit power to a power backplane in each of the server chassis through a power bus bar. DC power is provided by both power supplies to each server in the rack through the power bus bar and a power backplane located in the same chassis. Each power supply is sufficient to power the entire rack. Servers within separate chassis are coupled into the same network by merely daisy chaining the switches in the rack. Individual servers are deployed by sliding the servers into a server chassis to engage connectors in the backplanes.

25 Claims, 5 Drawing Sheets

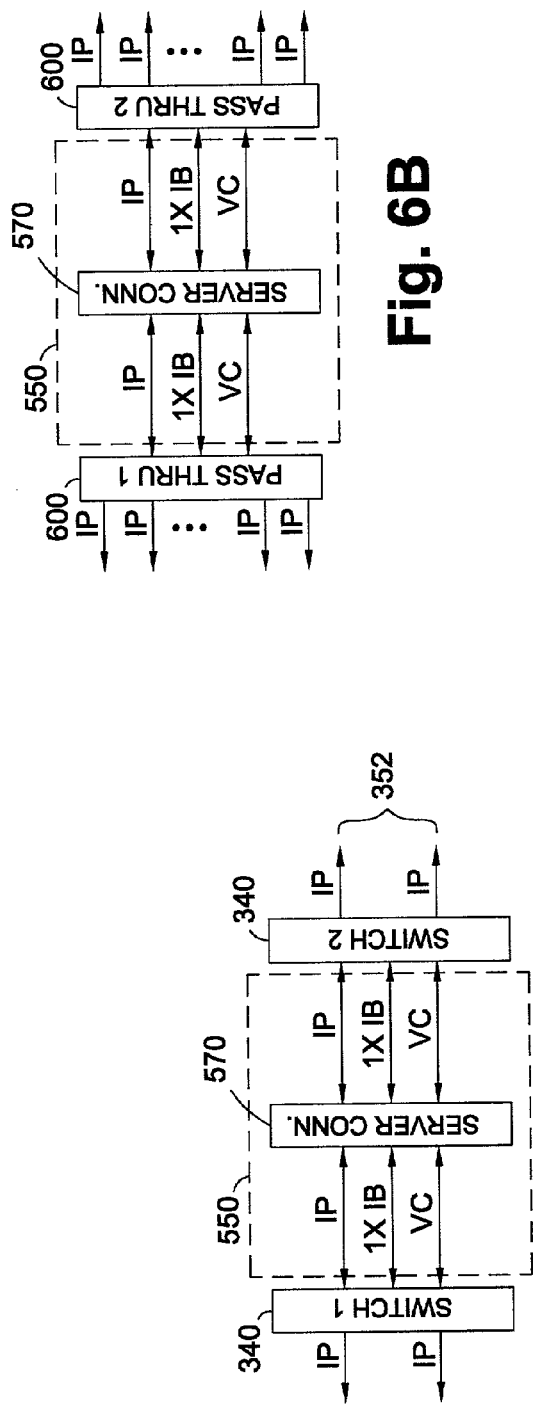
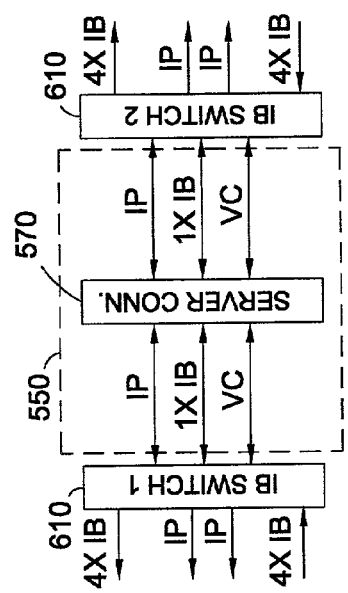
Fig. 6A
Fig. 6B
Fig. 6C

REDUNDANT DATA AND POWER INFRASTRUCTURE FOR MODULAR SERVER COMPONENTS IN A RACK

CROSS-REFERENCE TO RELATED APPLICATIONS

This application is related to co-pending application Ser. No. 09/966,180, filed Sep. 28, 2001 entitled "Intelligent Power Management For A Rack Of Servers."

STATEMENT REGARDING FEDERALLY SPONSORED RESEARCH OR DEVELOPMENT

Not applicable.

BACKGROUND OF THE INVENTION

1. Field of the Invention

The present invention generally relates to rack mounted computer servers. More specifically, the preferred embodiment relates to data and power distribution between and among servers within a rack system. More particularly still, the preferred embodiments of the present invention relate to a modular infrastructure for distributing redundant power and data in a rack system.

2. Background of the Invention

Conventional rack mount servers provide a flexible and effective way of providing varying levels of computing power in a relatively small volume. Within a single rack, multiple servers may be coupled together to perform common tasks. In addition, servers of different sizes may be installed in a rack to provide different levels of storage or processing capacity. Adding to this flexibility is the fact that the size of racks and servers are rather standardized. Many conventional racks comply with the EIA ("Electronic Industries Alliance") standard 19 inch width for server and laboratory equipment racks. In addition to this width standard, many conventional rack mount servers also comply with the a unit height ("U") standard of 1.75 inch. Thus, a 1U server has a height of 1.75 inch while a 4U server is 7 inches high. Thus, servers of different sizes may be installed in different combinations within a server rack to provide a fully tailored system.

Unfortunately, along with this expandability comes the complexity of deploying a fully configurable system. The interconnection fabric for conventional rack mounted server networks is system dependent and must be developed from scratch. With conventional rack systems, multiple cables must be connected to each server for data, power, system management and any other device dependent connections. A typical deployment involves dozens of power and data cables that must be routed and neatly bundled to prevent cross-talk or other interference. It can literally take hours to wire up and deploy a single rack. Deploying multiple racks adds to the complexity because cables are needed for every server in every rack.

If system administrators wish to combine servers in separate racks into a common network, a switch or hub must be incorporated in the racks to transmit data between racks and among servers within a rack. This once again adds to the complexity of the system as provisions must be made for space and wiring of the switch/hub. Unless these provisions are made ahead of time, an existing network must be modified. Unfortunately, modification of a network of rack servers is complicated by the fact that cables often need rerouting and rebundling. This example is just one of many showing how deployment of a network of conventional rack mounted servers requires extensive planning and forethought. Conventional rack server networks are simply not easily deployed or modified.

Another problem with conventional systems arises when an individual server needs to be replaced. In large network applications such as with service providers, it is not uncommon for multiple racks to sit side by side, lining the walls of entire rooms. In this scenario, access to the rear of any individual rack is limited. To disconnect and remove a single server, the entire rack must be pulled out or positioned to access the rear of the server and the correct cables must be located and disconnected. As one can see, replacing a single rack mounted server can be inconvenient and time consuming.

In light of these issues, it would therefore be desirable to provide an infrastructure for rack mounted server components that eliminates much of the cabling that is required in conventional systems. The novel infrastructure would advantageously decrease the amount of time required to deploy a rack of servers. In addition, the improved method would facilitate the rapid replacement of individual servers within a rack.

BRIEF SUMMARY OF THE INVENTION

The problems noted above are solved in large part by a computer server rack, comprising a plurality of modular server chassis, each chassis configured to hold a plurality of servers and at least one data aggregator. Each server is preferably enclosed in a housing called a server blade. The data aggregator, which is preferably implemented as an Ethernet network switch, is coupled to each server in the same chassis via a point to point link. The data aggregator may also be implemented using an Infiniband network switch. The point to point link is preferably encapsulated in a data backplane. Individual servers in a chassis are coupled to a network by coupling the aggregator in the same rack to the network. Preferably, each chassis includes at least a second aggregator coupled to each server in the same chassis. This second aggregator is coupled each server in the chassis via a redundant copy of the same point to point link that exists between the first aggregator and each server in the same chassis.

Each rack also comprises at least one group of AC to DC power supplies. The rack further includes a power bus bar configured to transmit power from the power supplies to a power backplane in each server chassis. DC power is provided to each server in the rack through the power bus bar and through the power backplane located in the same chassis. A redundant second group of AC to DC power supplies are also configured to transmit power to the power backplane in each server chassis through a redundant second power bus bar. In this manner, DC power from both the first and the second groups of AC to DC power supplies is provided to each server in the rack through their own power bus bar and the power backplane located within the same chassis. A power connector at the rear of each server blade enclosure mates with a mating power connector on the power backplane. The power backplane also includes a fuse between the power supply and each device slot.

For data transmissions, a data connector at the rear of each server blade enclosure mates with a mating server data connector on the data backplane. Each switch also couples to the data backplane with mating data connectors. The point to point links in the data backplane preferably comprise an Ethernet link, an infiniband link, and a server management link. Network connections external to the chassis are established with data cables. That is, switches in different chassis are connected using a data cable. In addition, servers in a chassis are connected to a network by coupling the switches in those chassis to the network using a data cable as well. Connecting servers in different racks is also accomplished by coupling switches in those racks using a single data cable.

Each modular server chassis preferably includes a plurality of server slots, each server slot configured to accept the server blades. The switches are preferably located on opposite sides of the chassis. In the preferred embodiment, each chassis holds 8 servers and two switches and has a height equivalent to six standard rack units ("Us") or 10.5". In contrast with conventional rack mount server systems, the server and network device slots in the preferred embodiment are vertical slots.

BRIEF DESCRIPTION OF THE DRAWINGS

For a detailed description of the preferred embodiments of the invention, reference will now be made to the accompanying drawings in which:

FIG. 6A shows the preferred point to point network data link within the preferred data backplane;

FIG. 6B shows an alternate embodiment using the preferred point to point network data link within the preferred data backplane; and FIG. 6C shows yet another alternate embodiment using the preferred point to point network data link within the preferred data backplane.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. In addition, the following non-limiting definitions are provided to aid in understanding the preferred embodiments of this invention:

Rack—a rack is a structural system that forms a frame for mounting other devices therein in a rack mounted computer system. The rack could be as simple as a top, a bottom and four corner pieces forming the structure, but may also include decorative or functional coverings around and on those structural components.

Chassis—a chassis is a structure, typically smaller than the overall rack, that is mounted within the rack. In the preferred embodiments of the present invention, individual servers are mounted in the rack mounted system by insertion into the chassis structures. A chassis may alternatively be referred to as a port or an enclosure.

Server—a server is an individual computer mounted within a rack system. Because most computers mounted in rack systems perform server-type operations, throughout this discussion those devices will be referred to as servers. However, the description herein pertains equally to any rack mounted computer system performing server operations or otherwise.

DETAILED DESCRIPTION OF THE PREFERRED EMBODIMENTS

Figure 1:
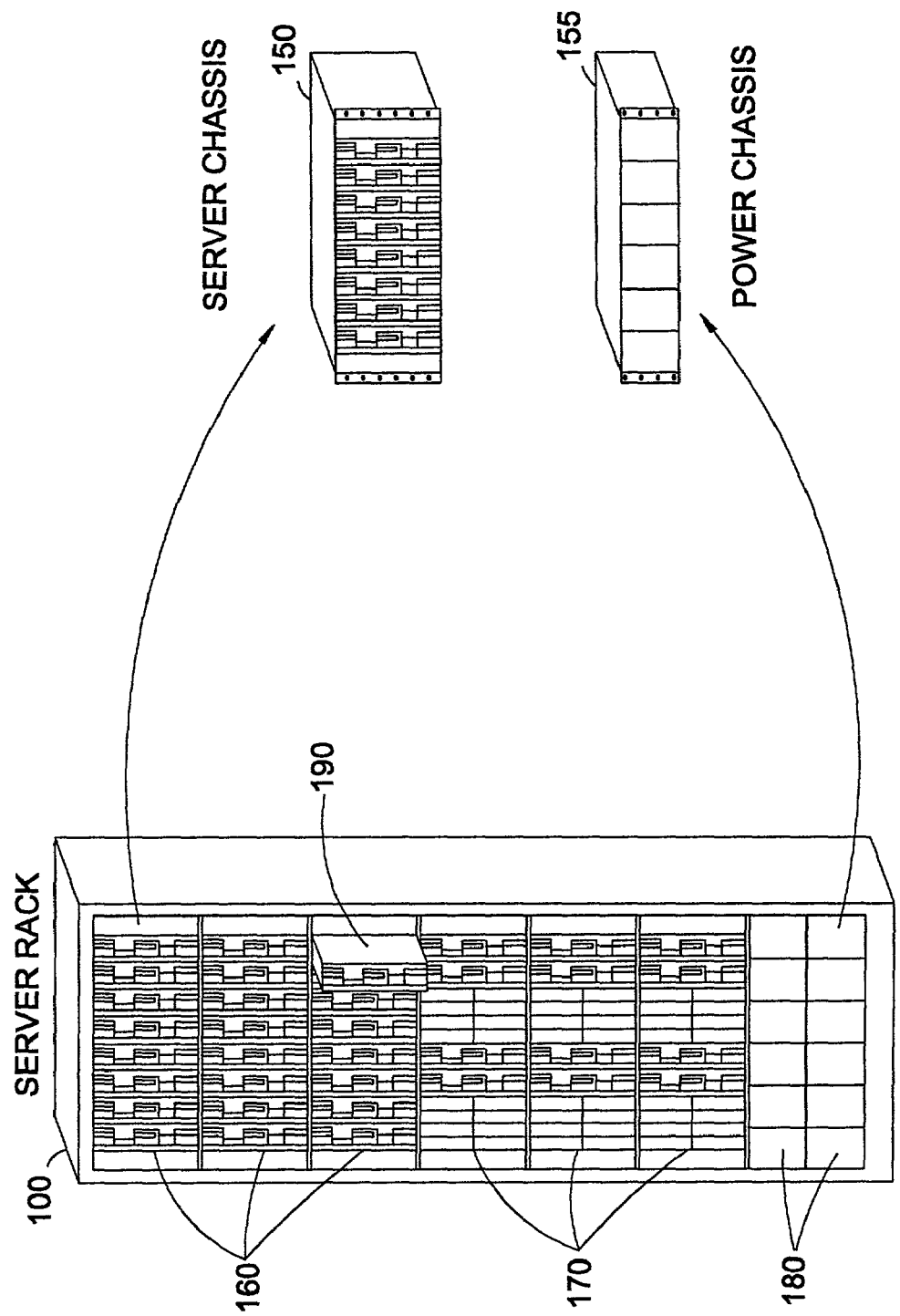
FIG. 1 shows a pictorial representation of a computer server rack, server chassis, and power chassis in accordance with the preferred embodiment.

Referring now to FIG. 1, rack system 100 represents a server rack in accordance with the preferred embodiment. Rack 100 is preferably configured to accept 19 inch wide rack equipment in compliance with EIA width standards and RETMA mounting standards. Rack 100 preferably comprises various chassis, server, and power supply components as depicted. For illustrative purposes, server rack 100 is fitted with hardware comprising different types of servers 160, 170 and power supplies 180. Power supplies 180 are preferably redundant supplies that provide power to servers 160, 170. By way of example, and not by way of limitation, the servers shown in FIG. 1 include application servers 160 and back-end servers 170. Server rack 100 may also be fitted with other hardware and in different configurations as will be recognized by those skilled in the art. For the purposes of this description of the preferred embodiment, however, it may be assumed that the rack includes servers of the type described herein. Application servers 160 are preferably designed for less demanding tasks than the back-end servers 170. For example, application servers 160 may be used for web and ASP ("Application Service Provider") hosting or media streaming while back-end servers 170 might be used as database servers or as gateways to a storage area network. In general, because of larger processing and storage requirements, the back-end servers 170 may occupy a larger volume of space than the application servers 160. It should also be noted that other servers, such as front-end servers (not shown), that may be used for tasks such as individual web servers or for dedicated applications such as firewalls or for DNS lookup may also be included in rack 100.

Each of the servers 160, 170 are preferably encased in a modular, removable housing called a "blade" 190. These blades 190, in turn, are installed in a vertical configuration in any of a plurality of modular chassis subframes 150 within rack 100. Similarly, the power supplies are enclosed in a separate power supply chassis 155. According to the preferred embodiment, the server rack 100 preferably includes six server chassis 150 and two power chassis 155. Within any server chassis 150, server blades 190 are designed to be fully interchangeable with one another. Thus, if a server goes down and needs to be replaced, the existing blade is simply swapped for a new blade. As the blades are inserted into a given chassis, connectors at the rear of the blade couple to mating connectors at the rear of the chassis to provide power and data connectivity. The blades are preferably locked into place in the chassis with any suitable latching hardware such as quick-release latches, thumb-screws, or some other type of captive hardware or retaining devices.

The blade form factor for application servers 160 may be smaller than for back-end 170 servers. However, in accordance with the preferred embodiment, each of these types of server blades may be installed in any location within the server rack 100. More specifically, the server chassis 150 are preferably configured to accept any type of server 160, 170. Naturally, the size of the various types of servers 160, 170 will determine how many of each server will fit in a given chassis 150.

Figure 2:
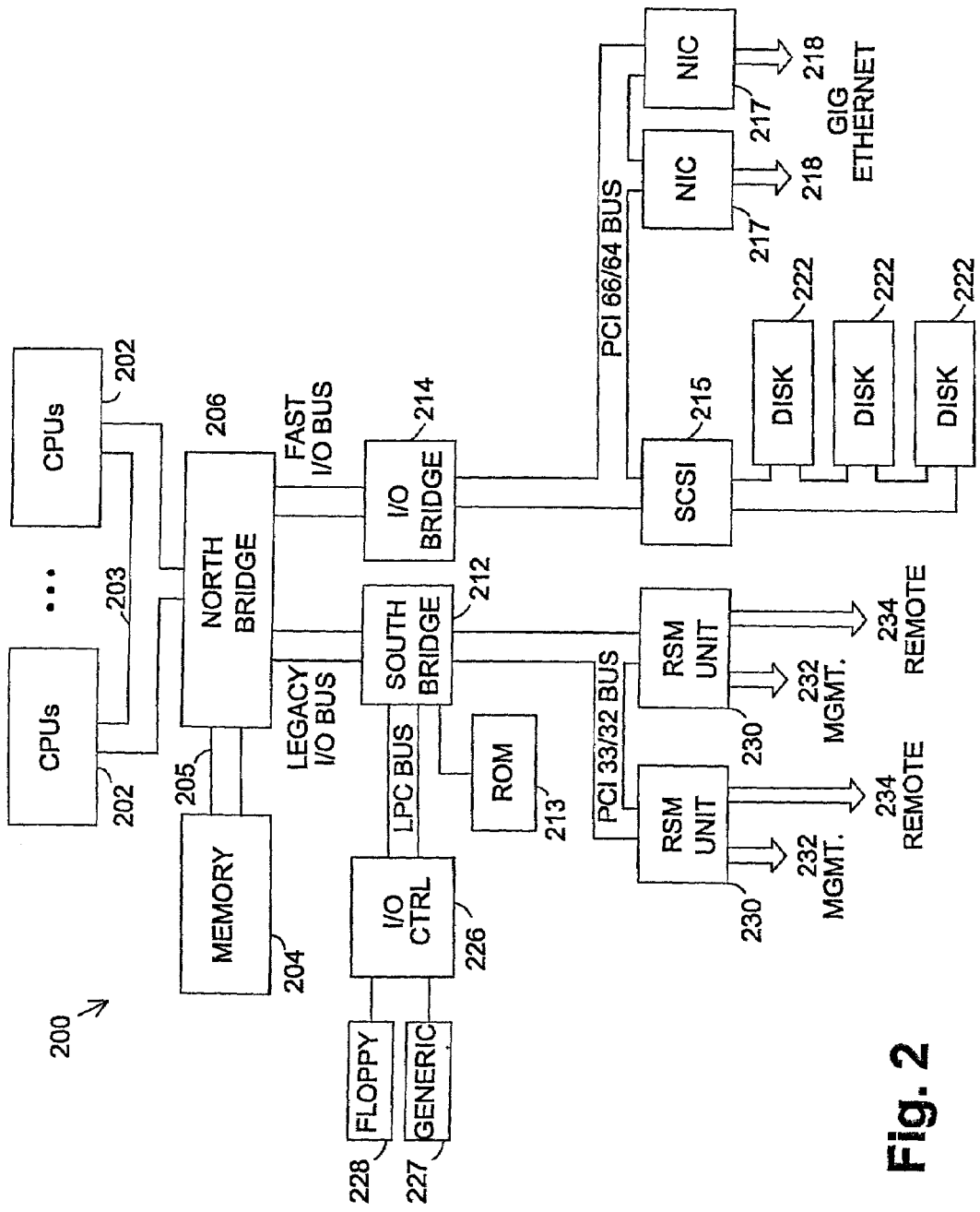
FIG. 2 shows a block diagram of a computer server with which the preferred embodiment may be implemented.

Referring now to FIG. 2, a representative server system 200 that may be encased in server blade 190 is illustrated. It is noted that many other representative configurations exist and that this embodiment is described for illustrative purposes. The server 200 of FIG. 2 preferably includes multiple CPUs 202 coupled to a bridge logic device 206 via a CPU bus 203. The bridge logic device 206 is sometimes referred to as a "North bridge" for no other reason than it often is depicted at the upper end of a computer system drawing. The North bridge 206 also preferably comprises a memory controller (not shown) to access and control a main memory array 204 via a memory bus 205. The North bridge 206 couples CPUs 202 and memory 204 to each other and to various peripheral devices in the system via one or more high-speed, narrow, source-synchronous expansion buses such as a Fast I/O bus and a Legacy I/O bus. The North bridge 206 can couple additional "high-speed narrow" bus links other than those shown in FIG. 2 to attach other bridge devices and other buses such as a PCI-X bus segment to which additional peripherals such as a Fibre Channel or Infiniband adapters (not shown) may be coupled. The embodiment shown in FIG. 2 is not intended to limit the scope of possible server architectures.

The Fast I/O bus shown in FIG. 2 may be coupled to the North bridge 206. In this preferred embodiment, the Fast I/O bus attaches an I/O bridge 214 that provides access to a high-speed 66 Mhz, 64-bit PCI bus segment. A SCSI controller 215 preferably resides on this high speed PCI bus and controls multiple fixed disk drives 222. In accordance with the preferred embodiment, the disk drives 222 are preferably hot-pluggable, but may also be fixed. The high speed PCI bus also provides communications capability to network interface cards ("NIC") 217 that provide redundant access to a Gigabit Ethernet network 218 for communication with other computers or servers. The redundant NICs 217 may be integrated onto the motherboard as presumed by FIG. 2, or they may be plugged into expansion slots (not shown) that are connected to the PCI bus.

The Legacy I/O bus is preferably used to connect legacy peripherals and a primary PCI bus via a separate bridge logic device 212. This bridge logic 212 is sometimes referred to as a "South bridge" reflecting its location vis-a-vis the North bridge 206 in a typical computer system drawing. An example of such bridge logic is described in U.S. Pat. No. 5,634,073, assigned to Compaq Computer Corporation. The South bridge 212 provides access to the system ROM 213 provides a low-pin count ("LPC") bus to legacy peripherals coupled to an I/O controller 226. The I/O controller 226 typically interfaces to basic input/output devices such as a floppy disk drive 228 and, if desired, various other input switches such as a generic I/O port 227 or a power switch and a suspend switch (not shown). The South bridge 212 also may provide one or more expansion buses, but preferably provides a 32-bit 33 Mhz PCI bus segment on which various devices may be disposed. It should be noted that the Legacy I/O bus may be narrower than other "high speed narrow" buses if it only needs to satisfy the bandwidth requirements of peripherals disposed on the 33 Mhz, 32-bit PCI bus segment.

Various components that comply with the bus protocol of the 33 Mhz, 32-bit PCI bus may reside on this bus, such as redundant Remote Server Management ("RSM") units 230. According to the preferred embodiment, the RSM 230 is a multipurpose management ASIC chip that provides various management facilities. The RSM ASIC 230 preferably includes an input/output ("I/O") processor (not shown) to provide intelligent control of the management architecture in the server 200.

In addition, the RSM 230 also preferably includes one or more out-of-band communication interfaces such as a remote or virtual console interface 234 and a power management interface 232. These communication interfaces permit out-of-band communication. with the RSM 230 to enable remote monitoring, control, and detection of various system management events, including power requirements for the server 200. Thus, in the event of a system failure or errors, a system administrator may remotely connect to server 200 through the virtual console interface 234 to perform a number of tasks including system monitoring and diagnosis. This connection may also allow an administrator to draw up diagnostic programs, perform a PXE boot, or perhaps even load an operating system ("OS") onto server 200.

Figure 3:
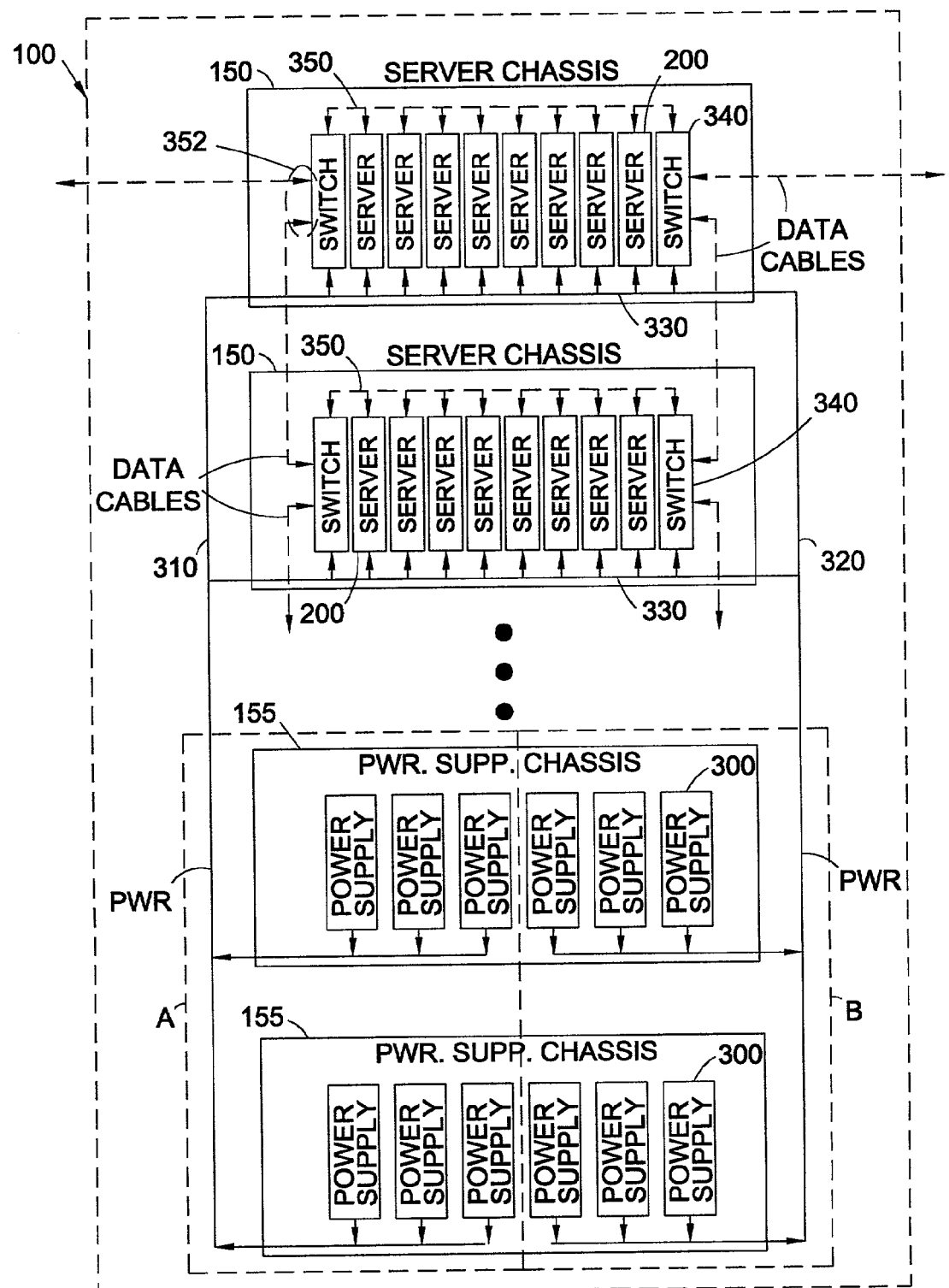
FIG. 3 shows a block diagram showing the preferred power and data distribution scheme within a server rack.

Referring now to FIG. 3, a schematic representation of the power and data distribution system in server rack 100 is shown. In FIG. 3, rack 100 includes two power supply chassis 155 and, in the interest of clarity, two (instead of the preferred six) server chassis 150. According to the preferred embodiment, each power supply chassis 155 includes six separate power supplies 300 capable of converting AC voltage into DC voltage. The DC voltage is transmitted to the rack components using a power bus bar scheme described in more detail below. Each server chassis 150 preferably holds up to 8 individual servers 200 and two network aggregators, which are preferably implemented using Ethernet network switches 340.

The power distribution system is designed to be completely redundant. That is, the power supplies are preferably divided into A and B halves, with each half providing power to each component in the rest of the rack 100. This power redundancy is shown in FIG. 3, where the power supplies 300 on the left half of the rack 100 distribute power along the A distribution path 310 and the power supplies 300 on the right half of the rack 100 distribute power along the B distribution path 320. AC power may be provided to all the power supplies 300 from a common source, but is preferably provided to each half A & B from separate AC supplies for additional redundancy. Power from the power supplies 300 are transmitted to each server chassis 150 and then routed 330 within the chassis to each component within the chassis. The links 330 as depicted in FIG. 3 should not be interpreted to mean that servers 200 have a single power connection, but rather that each server has a separate connection to both DC power distribution paths 310 and 320. During normal operations, the components within each chassis 150 preferably operate using power from the A and B sides of power supplies 300, however it must be noted that each half is completely sufficient to power the entire rack 100. Thus, if separate AC supplies are used and one of these AC supplies fails, the rack 100 can remain in operation. It should also be noted that while the power supplies in FIG. 3 have been split into redundant left and right halves (A & B), redundancy may also be obtained by splitting the power supplies into top and bottom halves or some other suitable division. Furthermore, it is also possible that more than two subdivisions of the power supplies may be implemented for further redundancy.

The data transmission paths in rack 100 are represented in FIG. 3 by dashed arrows. Each server chassis 150 preferably includes switches 340 on both sides of the chassis. In accordance with the preferred embodiment, each switch 340 has point to point data links 350 with each server 200 and also preferably includes at least two open connector ports 352. These open connector ports 352 in each switch 340 permit cable connections between server chassis 150 or external networks. The point to point links 350 as depicted in FIG. 3 should not be interpreted to mean that servers 200 are interconnected to one another, but rather that each individual server is linked to the switches 340 at either end of the chassis 150. The data links are shown in greater detail in FIGS. 6A–6C and discussed below.

In accordance with the preferred rack mount server system, the only data connections requiring physical cables are those that are coupled to the connector ports 352 in switches 340. All other power or data transmissions 330, 350 take place along a power bus bar, a power backplane and a data backplane as shown in FIGS. 4, 5, and 6A–6C. Data and power connections for each individual server 200 are provided by connectors within the data and power backplanes. As each server is inserted and seated within a server chassis 150, connectors at the rear of the server mate with connectors in the data and power backplanes for full connectivity. Thus, the preferred embodiment eliminates most of the cabling required with conventional rack mount servers. The full scope of the power and data infrastructure is discussed below.

Figure 4:
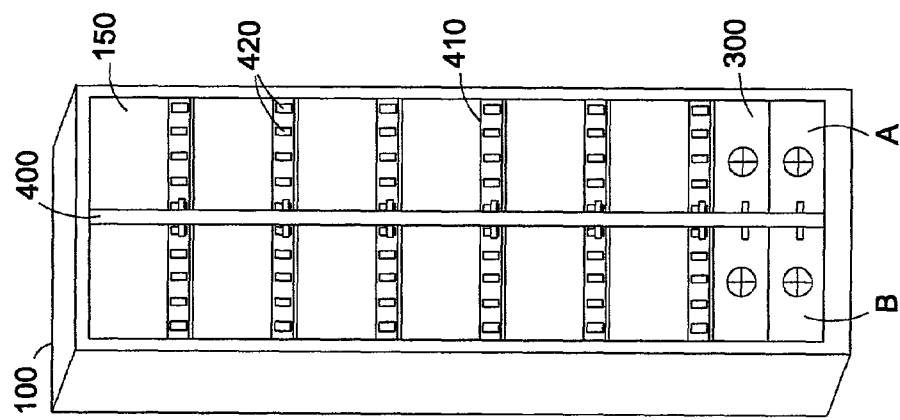
FIG. 4 is a rear isometric view of a server rack showing the preferred power bus bar and power backplane distribution scheme.

Referring now to FIG. 4, an isometric view of the rear of server rack 100 is shown. In FIG. 4, servers 200 and data backplanes are omitted for clarity. Instead, only the power supplies 300, server chassis 150 and power bus infrastructure are shown. The preferred power distribution scheme uses a dual vertical bus bar 400 to transmit power from the power supplies to the remainder of the rack. In accordance with the preferred embodiment, the power supplies convert AC voltage from an external source and transmit 48 VDC at 400 amps to the bus bar 400. From the bus bar 400, a power backplane 410 attached to each server chassis 150 taps power from the bus bar 400. As discussed above, the power distribution scheme is redundant and therefore, the bus bar 400 transmits DC voltage from the A & B halves of the power supply along separate voltage supply lines. Each power backplane 410 is then coupled to the A & B voltage lines in the bus bar 400. The power backplane 410, which is preferably manufactured of printed circuit board materials, transfers DC voltage from each voltage line (A & B) to each server slot in server chassis 150. In FIG. 4, the power termination for each server slot is shown as a single connector 420, but separate connectors for the A & B voltage sources may also be implemented. Furthermore, in addition to powering servers 200, the power backplane also includes connectors to provide power to switches 340.

The power backplanes 410 are predominantly passive in that they simply transmit voltage from source (power bus bar 400) to destination (slot connectors 420). However, the power backplanes 410 may also be manufactured with electronic fuses or breakers (not specifically shown) for each voltage transmission line in the backplane. Fuses such as these operate to isolate voltage and current surges and may advantageously prevent electronics damage to servers 200 and/or power supplies 300 caused by shorts in any single server. Such fuses also prevent a single server power fault from shutting down other servers 200 in the chassis 150.

Figure 5:
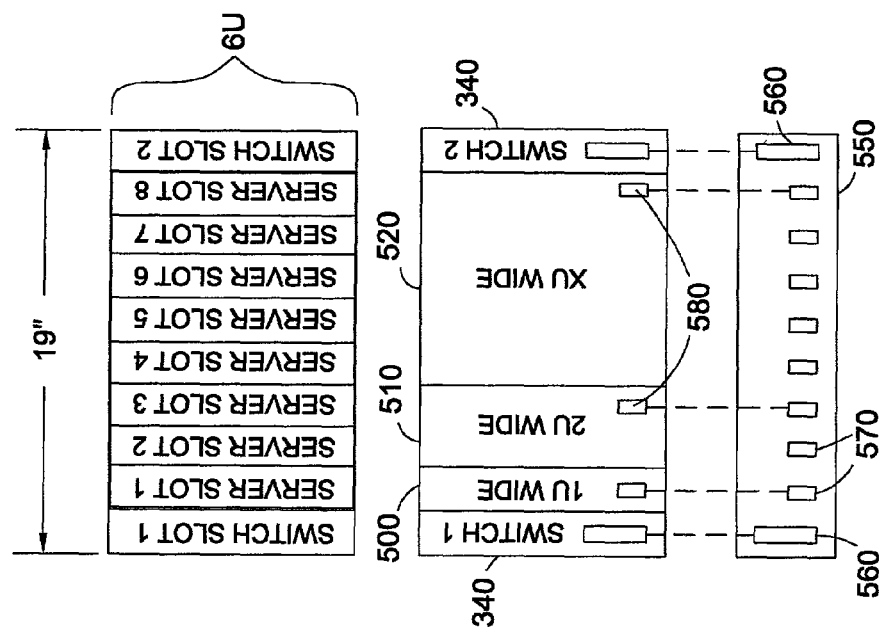
FIG. 5 shows a diagrammatic representation of the server footprint along with the preferred data backplane within the preferred server chassis.

Referring now to FIG. 5, the footprint for a single server chassis 150 is shown. In accordance with the preferred embodiment, each chassis is installable in an EIA standard 19" wide rack and has a 6 U height. That is, each chassis has a height of 10.5". Each chassis 150 preferably holds two switches 340 and has slots to hold eight 1 U wide server blades 500. It should be noted that in contrast to conventional rack mount servers, which are installed horizontally into a rack, the server blades 190 that are inserted into each server chassis 150 are predominantly vertical. This form factor for one slot wide server blades 500 permits a front faceplate that fits at least two hot-plug hard drives (not shown) that may be removed from the front of a server without the need to remove the entire server.

As discussed above, servers are designed to perform different tasks and, depending on the storage or processing capacity required, the size of the servers may differ. The preferred server chassis design described herein is configured to accept servers of various widths. For instance, in FIG. 6, the center block shows that the preferred server chassis footprint readily accepts a one slot wide server blade 500, a two slot wide server blade, or any general server blade whose width is some integer multiple of the standard slot width. Added together, the sum of the slot widths of the servers in the preferred chassis cannot exceed eight, although smaller numbers are certainly permissible. Thus, in the example provided in FIG. 6, server blade 520 is five server slots wide and fits in a chassis with server blades 500, 510 and switches 340.

The data transmission infrastructure uses a data backplane 550 associated with each server chassis 150. In conjunction with the standard server chassis footprint, the data backplane includes connectors for each of the eight server slots 570 and the two switches 560. As with the power backplane 410, the data backplane 550 is preferably manufactured from printed circuit board materials and the connectors are preferably VHDM (very high density metric) connectors. Mating connectors 580 are accessible from the rear of the servers 500, 510, 520 and switches 340 installed in the server chassis 150. Once installed, the mating connectors 580 in the server couple with the data backplane connectors thus providing full network connectivity in a matter of seconds. For servers that occupy more than one slot in the server chassis 150, the server may conceivably only use one mating connector on the backplane 550, thereby leaving some of the backplane connectors 570 unused. Naturally, those skilled in the art will recognized that many backplane material and connector configurations are certainly possible. Further, it is also possible that multiple connectors may be used for each chassis slot provided that mating connectors are properly positioned on the server blades.

The data backplanes 550 preferably include traces creating the point to point links 350 between each server 200 and each switch 340 in a chassis 150 as discussed above in conjunction with FIG. 3. More specifically, the data backplane provides redundant data transmission lines from each server connector 570 to each switch connector 560. The specific data lines are shown more clearly in FIG. 6A, which shows the preferred data transmission links. In the preferred embodiment, a server connector 570 for one server slot is shown, but identical data transmission lines are built into the data backplane for every server slot. Thus, the remaining server connectors are omitted from FIG. 6A for clarity.

In accordance with the preferred embodiment, each server connector 570 is coupled to six different signal traces. These signal traces include redundant copies of three distinct data links: an internet protocol ("IP") link, an infiniband ("IB") link, and a virtual console ("VC") link, all discussed above in conjunction with the representative server of FIG. 2. The IP link may be a 10 Mbps, 100 Mbps, or 1 Gig Ethernet network. The VC link is also preferably an Ethernet link while the IB link is preferably a 1× (dual differential pair) infiniband link. FIG. 6A also shows the two connector ports 352 discussed above. In the preferred embodiment, the switches 340 are Ethernet switches and, therefore, information forwarded along the IP and VC Ethernet lines are forwardable via the connector ports 352. The IB links are included for future expandability and are intended to be used with IB switches as shown in FIG. 6C.

A distinct feature of the preferred infrastructure is that the power and data components are modular and therefore exchangeable and upgradable. For instance, in FIG. 6B, switches 340 are replaced with simple Ethernet pass through devices 600 that merely forward data received along each of the Ethernet links received at the data backplane connectors 560. As such, instead of two Ethernet output ports 352 as shown in FIG. 6A, a plurality of IP or Ethernet signals are transmitted along by the pass through devices 600.

FIG. 6C shows a similar example wherein the switches 340 are replaced with infiniband switches. In this scenario, the switches are capable of handling both IP and IB data and, as such, the output from these switches include a combination of IP and IB ports. This alternative configuration may advantageously accommodate a 4× (eight differential pairs) IB uplink and downlink connections as well as IP connections at each IB switch. As such, the preferred embodiment may advantageously provide access to storage area networks and other networks that comply with the infiniband connectivity protocol.

In each of the examples 6A–6C, the external connection ports preferably provide a way to connect each of the servers within that chassis. The redundancy built into this infrastructure provides less reliance on a single data aggregator or network device, whether it be the preferred switch, a network hub, or a pass through device. In the preferred embodiment, switch 340 has two connector ports 352 that permit multiple server chassis 150 to be coupled. Servers in different racks 100 may be coupled by connecting switches 340 from each rack with a single cable. Within a rack, switches may be daisy chained together to form a larger network. Given that switches in adjacent server chassis are in close proximity to one another, the cables that are used to daisy chain the switches are short in length. Consequently, cable quantities and weight are significantly reduced over convention server racks. Thus, the preferred embodiment eliminates most of the cabling required in conventional rack mount server systems while at the same time providing a flexible infrastructure for creating a user-configured network.

The end result of these advantages is that the improved server infrastructure reduces the amount of time needed to deploy a rack of servers. In addition, when a server fails, server downtime is reduced because a server can be removed and installed in a matter of seconds. Furthermore, the preferred embodiment provides redundant power and data pathways for high reliability. The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer server rack, comprising:
   a plurality of modular server chassis, each chassis configured to hold a plurality of servers and at least one data aggregator coupled to each server in the same chassis via a point to point link;
   at least one group of AC to DC power supplies;
   a power bus bar configured to transmit power from the power supplies to a power backplane in each server chassis;
   wherein DC power is provided to each server in the rack through the power bus bar and the power backplane located in the same chassis.

2. The computer server rack of claim 1 further comprising:
   a second group of AC to DC power supplies configured to transmit power to the power backplane in each server chassis through the power bus bar;
   wherein DC power from both the first and the second groups of AC to DC power supplies is provided to each server in the rack through the power bus bar and the power backplane located in the same chassis.

3. The computer server rack of claim 2 wherein servers in a chassis are coupled to a network by coupling the aggregator in the same rack to the network.

4. The computer server rack of claim 3 wherein the aggregator is an IP network switch.

5. The computer server rack of claim 3 wherein the aggregator is an Infiniband network switch.

6. The computer server rack of claim 3 wherein each server chassis further comprises:
   a second aggregator coupled to each server in the same chassis via a redundant copy of the point to point link between the first aggregator and each server in the same chassis.

7. The computer server rack of claim 1 wherein the power backplane comprises a circuit board.

8. An method for providing data and power connectivity to a plurality of rack mount servers comprising:
   housing each server in a chassis;
   housing a first network switch in each chassis;
   coupling the first switch to each server in the same chassis with a point to point network link;
   housing a plurality of chassis in a rack;
   housing a plurality of power supplies in the rack;
   transmitting power from the power supplies to a power bus bar;
   transmitting power from the power bus bar to each chassis via a power backplane; and
   connecting servers in separate chassis to the same network by coupling the switches in those chassis to one another.

9. The method of claim 8 further comprising:
   housing a second network switch in each chassis; and
   coupling the second switch to each server in the chassis with the same point to point network link as between each server in the chassis and the first network link.

10. The method of claim 9 further comprising:
    enclosing each server in a blade enclosure.

11. The method of claim 10 further comprising:
    subdividing the power supplies into at least two groups;
    transmitting power from each group of power supplies to a separate power transmission line in the bus bar;

transmitting power from each power transmission line to each server and switch in each chassis through a power backplane at the rear of each chassis.

12. The method of claim 10 further comprising:
coupling a power connector at the rear of each server blade enclosure with a mating power connector on the power backplane.

13. The method of claim 10, further comprising:
encapsulating the point to point links in a data backplane; and
coupling a data connector at the rear of each server blade enclosure with a mating server data connector on the data backplane.

14. The method of claim 13, further comprising:
coupling a switch connector at the rear of the switches with a mating switch data connector on the data backplane; and
coupling the switches in separate chassis using a data cable.

15. The method of claim 8, further comprising:
connecting servers in different racks by coupling switches in those racks using a single data cable.

16. The method of claim 8, further comprising:
connecting servers in a chassis to a network by coupling the switches in those chassis to the network.

17. A modular server chassis installable in a rack and configured to hold a plurality of servers comprising:
a plurality of server slots, each server slot configured to accept a server encased in a server blade;
a plurality of network device slots, each network device slot configured to accept a network device;
a data backplane; and
a power backplane;
wherein network connectivity for each server is provided through point to point links in the data backplane between each server slot and each network device slot.

18. The server chassis of claim 17 wherein the server and network device slots are vertical slots.

19. The server chassis of claim 18 wherein the server chassis holds 8 server blades, each blade having a 1 U width and two switches.

20. The server chassis of claim 19 wherein the server chassis has a 6U vertical height.

21. The server chassis of claim 17 wherein;
the power backplane is configured to transmit power from a plurality of redundant power supplies to each server and network device slot.

22. The server chassis of claim 21 wherein;
the power backplane further comprises a fuse between the power supply and each device slot.

23. The server chassis of claim 21 wherein;
the power backplane further comprises a VHDM connector for each server slot and each network device slot configured to mate with a mating connector on the server blades and network devices to transmit power to the server blades and network devices.

24. The server chassis of claim 17 wherein the point to point links in the data backplane comprise:
an Ethernet link;
an infiniband link; and
a server management link.

25. The server chassis of claim 24 wherein;
the data backplane further comprises a VHDM connector for each server slot and network device slot configured to mate with a mating connector on the server blades and network devices to transmit signals along the point to point links between the server blades and network devices.

* * * * *

UNITED STATES PATENT AND TRADEMARK OFFICE
CERTIFICATE OF CORRECTION

PATENT NO. : 7,138,733 B2 Page 1 of 1
APPLICATION NO. : 10/017785
DATED : November 21, 2006
INVENTOR(S) : Michael C. Sanders et al.

It is certified that error appears in the above-identified patent and that said Letters Patent is hereby corrected as shown below:

In column 2, line 41, after "coupled" insert -- to --.

In column 5, line 58, after "ROM 213" insert -- and --.

In column 12, line 4, in Claim 19, delete "1 U" and insert -- 1U --, therefor.

Signed and Sealed this

Twenty-eighth Day of July, 2009

JOHN DOLL
*Acting Director of the United States Patent and Trademark Office*